US008929123B2

(12) United States Patent
Kang et al.

(10) Patent No.: US 8,929,123 B2
(45) Date of Patent: Jan. 6, 2015

(54) RESISTIVE-SWITCHING DEVICE CAPABLE OF IMPLEMENTING MULTIARY ADDITION OPERATION AND METHOD FOR MULTIARY ADDITION OPERATION

(75) Inventors: Jinfeng Kang, Beijing (CN); Feifei Zhang, Beijing (CN); Bin Gao, Beijing (CN); Bing Chen, Beijing (CN); Lifeng Liu, Beijing (CN); Xiaoyan Liu, Haidian District (CN)

(73) Assignee: Peking University, Haidian District, Beijing (CN)

( * ) Notice: Subject to any disclaimer, the term of this patent is extended or adjusted under 35 U.S.C. 154(b) by 202 days.

(21) Appl. No.: 13/641,832

(22) PCT Filed: Nov. 18, 2011

(86) PCT No.: PCT/CN2011/082414
§ 371 (c)(1),
(2), (4) Date: Oct. 17, 2012

(87) PCT Pub. No.: WO2012/100585
PCT Pub. Date: Aug. 2, 2012

(65) Prior Publication Data
US 2013/0033922 A1 Feb. 7, 2013

(30) Foreign Application Priority Data

Jan. 28, 2011 (CN) .......................... 2011 1 0032218

(51) Int. Cl.
*G11C 11/00* (2006.01)
*G11C 13/00* (2006.01)
*G11C 11/56* (2006.01)

(52) U.S. Cl.
CPC ........ *G11C 13/0007* (2013.01); *G11C 11/5685* (2013.01); *G11C 13/0069* (2013.01); *G11C 2013/0073* (2013.01); *G11C 2013/0083* (2013.01)
USPC .......................................................... 365/148

(58) Field of Classification Search
USPC .......................................................... 365/148
See application file for complete search history.

(56) References Cited

U.S. PATENT DOCUMENTS 8,238,138 B2 *    8/2012   Kitagawa ...................... 365/148
2009/0010039 A1 *  1/2009   Tokiwa et al. ................. 365/148

(Continued)

FOREIGN PATENT DOCUMENTS

CN           101179095 A      5/2008
CN           101281952 A     10/2008

(Continued)

OTHER PUBLICATIONS

International Search Report for corresponding International Patent Application No. PCT/CN2011/082414 mailed Mar. 1, 2012.

*Primary Examiner* — Hoai V Ho
*Assistant Examiner* — Pablo Huerta
(74) *Attorney, Agent, or Firm* — Merchant & Gould P.C.

(57) ABSTRACT

The present disclosure provides a resistive-switching device capable of implementing multiary addition operation and a method for implementing multiary addition operation using the resistive-switching device. The resistive-switching device has a plurality of resistance values each corresponding to a respective data value stored by the resistive-switching device and ranging from a high resistance value to a low resistance value. The data value stored by the resistive-switching device is increased by '1' successively with a series of set pulses having a same pulse width and a same voltage amplitude being applied thereto. The data value stored by the resistive-switching device is set to '0' with a reset pulse being applied thereto, and meanwhile a data value stored by a higher-bit resistive-switching device is increased by '1' with a set pulse being applied thereto. In this way, multiary addition operation is implemented.

19 Claims, 2 Drawing Sheets

(56) References Cited

U.S. PATENT DOCUMENTS

2011/0026332 A1* 2/2011 Kitagawa .................. 365/189.05
2011/0122680 A1* 5/2011 Ikeda et al. .................... 365/148
2013/0119337 A1* 5/2013 Kang et al. ........................ 257/2

FOREIGN PATENT DOCUMENTS

| CN | 101826598 A | 9/2010 |
|---|---|---|
| CN | 101872837 A | 10/2010 |

* cited by examiner

US 8,929,123 B2

RESISTIVE-SWITCHING DEVICE CAPABLE OF IMPLEMENTING MULTIARY ADDITION OPERATION AND METHOD FOR MULTIARY ADDITION OPERATION

This application is a National Stage Application of PCT/CN2011/082414, filed 18 Nov. 2011, which claims benefit of Serial No. 201110032218.1, filed 28 Jan. 2011 in China and which applications are incorporated herein by reference. To the extent appropriate, a claim of priority is made to each of the above disclosed applications.

TECHNICAL FIELD

The present disclosure relates to the field of semiconductor integrated circuit and manufacturing technology thereof, and particularly relates to a resistive-switching device capable of implementing multiary addition operation and a method for implementing the multiary addition operation using the resistive-switching device.

BACKGROUND

Integrated circuit technology can implement various calculation functions in hardware. Addition operation is a core function for implementing the calculation functions. Subtraction, multiplication, and division operations can all be implemented based on the addition operation. Conventionally, the addition operation is binary operation implemented by transistor circuits. A simple one-bit full adder generally needs at least more than ten transistors. Multi-bit addition operations may need more transistors.

Resistive-switching Random Access Memory (RRAM) can store data by resistance variations, and has a wide application prospect as a next-generation non-volatile memory. Typically the RRAM comprises a top metal electrode, a bottom metal electrode, and a dielectric film therebetween having a resistive-switching characteristic. The resistive-switching layer typically comprises metal oxides, such as $TiO_2$, $HfO_2$, $ZrO_2$, $Ta_2O_5$, NiO, and ZnO, etc. The RRAM typically has two operation modes, i.e., a unipolar mode and a bipolar mode. In the unipolar mode, the RRAM is switched between a high resistance state and a low resistance state with a voltage that exhibits a same polarity at both ends of the RRAM being applied thereto. In the bipolar mode, the RRAM is switched between the high resistance state and the low resistance state with a voltage that exhibits different polarities at both ends of the RRAM being applied thereto. The RRAM can be used as a data memory, in which each resistance value corresponds to a data value. For example, a high resistance value corresponds to a data value '0', a resistance value lower than the high resistance value corresponds to a data value '1', and a resistance value that is even lower corresponds to a data value '2', and so on.

In a conventional computer, calculation and storage are independent from each other and are implemented by different modules or devices, respectively. If multiary calculations can be implemented by a simple structure and the calculation and the storage can be integrated, more data can be processed than by the conventional addition operation. Accordingly, operation efficiency can be improved.

SUMMARY

The present disclosure provides a resistive-switching device capable of implementing multiary addition operation and a method for implementing the multiary addition operation using the resistive-switching device.

According to an aspect of the present disclosure, there is provided a resistive-switching device capable of implementing multiary addition operation, comprising: a bottom electrode comprising a conductive material layer; a resistive-switching layer comprising a doped metal oxide layer deposited on the bottom electrode; and a top electrode comprising a conductive material layer deposited on the metal oxide layer. The resistive-switching device has a plurality of resistance values each corresponding to a respective data value stored by the resistive-switching device and ranging from a high resistance value to a low resistance value, wherein the high resistance value corresponds to a data value '0', and the low resistance value corresponds to a largest data value that can be stored by the resistive-switching device. The data value stored by the resistive-switching device is increased by 1 when the resistance value of the resistive-switching device decreases to an adjacent resistance value. The data value stored by the resistive-switching device is set to '0' when the resistance value of the resistive-switching device decreases to the low resistance value and meanwhile a data value stored by a higher-bit resistive-switching device representing an adjacent higher bit is increased by '1', whereby an addition operation in which the adjacent higher bit is increased by '1' is completed.

According to another aspect of the present disclosure, there is provided a method for implementing multiary addition operation using a resistive-switching device, which has a plurality of resistance values each corresponding to a respective data value stored by the resistive-switching device and ranging from a high resistance value to a low resistance value, wherein the high resistance value corresponds to a data value '0', and the low resistance value corresponds to a largest data value that can be stored by the resistive-switching device. The method comprises: initializing the resistive-switching device to store a value 'B'; determining whether a value 'A' that is to be added to the value 'B' is '0'; outputting the current data value stored by the resistive-switching device as a calculation result if the value 'A' is '0', and determining whether the current data value stored by the resistive-switching device is the largest value that can be stored by the resistive-switching device if the value 'A' is not '0'; setting the data value stored by the resistive-switching device to '0' if the current data value stored by the resistive-switching device is the largest value and meanwhile increasing a data value stored by a higher-bit resistive-switching device representing an adjacent higher bit by '1', so as to complete an operation in which the adjacent higher bit is increased by '1'; increasing the current data value stored by the resistive-switching device by '1' if the current data value stored by the resistive-switching device is not the largest value; and decreasing the value 'A' by '1', returning to the step of determining whether the value 'A' is '0' and performing the steps thereafter.

The resistance value of the resistive-switching device may decrease to an adjacent resistance value and the data value stored by the resistive-switching device may be increased by '1' when a set pulse is applied to the resistive-switching device; and the resistance value of the resistive-switching device may increase to a certain resistance value and the data value stored by the resistive-switching device may decrease to a data value corresponding to the certain resistance value when a reset pulse is applied to the resistive-switching device.

The resistance value of the resistive-switching device may decrease gradually when a series of set pulses having a same pulse width and a same voltage amplitude are applied thereto sequentially; and the resistance value of the resistive-switching device may increase to a resistance value corresponding to one of a plurality of different voltage amplitudes when one of a plurality of reset pulses having a same pulse width and the different voltage amplitudes are applied thereto.

The resistance value of the resistive-switching device may increase to the high resistance value when a reset pulse having a specific voltage amplitude is applied thereto, whereby the data value stored by the resistive-switching device is set to '0'.

The resistance value of the higher-bit resistive-switching device may decrease to an adjacent resistance value when a set pulse is applied thereto, whereby the data value stored by the higher-bit resistive-switching device is increased by '1'.

Optionally, the set pulse may be a positive pulse, and the reset pulse may be a negative pulse.

The resistive-switching device may be a unipolar resistive-switching device or a bipolar resistive-switching device.

One advantage of the present disclosure is that the multiary addition operation can be implemented by the resistive-switching device, which provides a premise for implementing more complicated calculations using the resistive-switching devices. As a result, storage and calculation can be integrated.

Another advantage of the present disclosure is that device structure for implementing the addition operation using the resistive-switching device is very simple. The multiary addition operation can be implemented by operation of one device. The circuit structure is substantially simplified compared with the transistor circuit, which facilitates integration of the circuit.

DETAILED DESCRIPTION OF THE PREFERRED EMBODIMENTS

Figure 1:
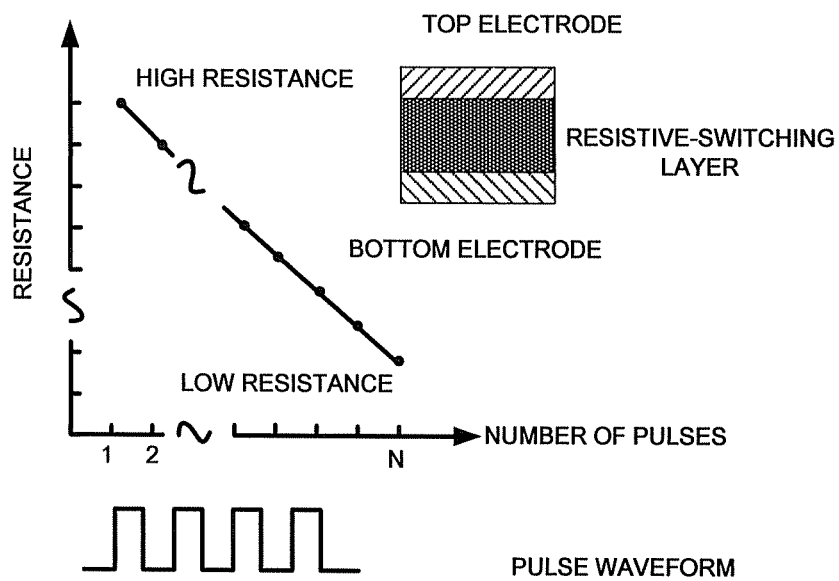
FIG. 1 shows a process in which a resistive-switching device switches from a high resistance state to a low resistance state.

Next, the present disclosure will be described in detail in connection with specific embodiments with reference to the drawings, so that objects, solutions, and advantages thereof will become more apparent.

Generally, a process in which a resistive-switching device switches from a high resistance state to a low resistance state may be defined as "set," while a process in which a resistive-switching device switches from a low resistance state to a high resistance state may be defined as "reset." The switching of the resistive-switching device between the high resistance state and the low resistance state is implemented by a conductive path in a resistive-switching dielectric layer switching between a broken state and a conductive state. For a metal oxide resistive-switching device, the conductive path is formed by oxygen deficiencies aligned in the oxide. The oxygen deficiencies increase when a pulse having a certain pulse width and amplitude is applied to the resistive-switching device in a high resistance state, causing the resistance to decrease. The resistance value of the resistive-switching device may decrease gradually in a predetermined manner if a series of identical set pulses are applied to the resistive-switching device sequentially. As a result, data value stored in the resistive-switching device increases gradually. In this way, multi-value storage and calculation are implemented simultaneously. On the other hand, the resistance value of the resistive-switching device in the low resistance state can return to a certain value if one of a plurality of reset pulses having a same pulse width and different amplitudes is applied to the resistive-switching device, because the reset process is mainly controlled by voltage amplitude. Different voltage amplitudes correspond to different broken degrees of the path and therefore different resistance values.

In implementing multiary addition operation, the resistive-switching device is initialized to store a value 'B'. Then a value 'A' is added to the value 'B' by applying pulses to the resistive-switching device to change the resistance value of the device accordingly. The resistance value of the resistive-switching device in a high resistance state decreases to an adjacent lower resistance value if a suitable set pulse is applied across the resistive-switching device. As a result, the data value stored by the resistive-switching device is increased by '1'. The resistance value of the resistive-switching device in the high resistance state varies from a high resistance value to a low resistance value gradually to take different intermediate resistance values, if a series of identical set pulses, which have a same pulse width and same voltage amplitude, are applied across the resistive-switching device. As a result, the data value stored by the resistive-switching device increases gradually from '0' to a largest value that can be stored by the resistive-switching device. As such, different number of set pulses may correspond to respective different intermediate resistance values. The current data value stored by the resistive-switching device is increased by '1' each time the resistance value thereof switches to an adjacent resistance value.

Furthermore, the resistance value of the resistive-switching device is no longer controlled by the set pulse once it reaches the low resistance state. The resistive-switching device remains in the low resistance state even if the set pulses are continuously applied thereto.

On the other hand, the resistance value of the resistive-switching device is increased to a certain value by the reset pulse, causing the data value stored by the resistive-switching device to be decreased by '1'. If the resistive-switching device reaches its highest resistance value, i.e., if the resistive-switching device is in the high resistance state, the data value stored by the resistive-switching device is '0'.

The resistive-switching device will directly return to the high resistance state if the reset pulse is applied thereto. Accordingly, the data value stored by the resistive-switching device is '0'. Meanwhile, an adjacent higher bit is increased by '1'. For example, the data value stored by the resistive-switching device is increased by '1' when a set pulse is applied thereto. The data value stored by the resistive-switching device becomes '0' when a reset pulse is applied to the resistive-switching device in the low resistance state so that it returns to the high resistance state and the adjacent higher bit is increased by '1'.

Next, the operation of the resistive-switching device according to the present disclosure will be explained. The resistive-switching device according to the predetermined disclosure comprises but is not limited to resistive-switching memory.

FIG. 1 shows a process in which the resistive-switching device switches from the high resistance state to the low resistance state.

As shown in FIG. 1, the resistive-switching device comprises a top electrode and a bottom electrode each comprising a conductive material, and a resistive-switching layer between the top electrode and the bottom electrode. The resistive-switching layer comprises a metal oxide layer deposited on the bottom is electrode. The metal oxide layer may comprise, e.g., $TiO_2$, $HfO_2$, $ZrO_2$, $Ta_2O_5$, NiO, and ZnO, etc. The metal oxide layer is doped with at least one dopant.

Initially, the resistive-switching device is in the high resistance state. The suitable set pulse can be achieved by a limited number of experiments. The resistance value of the resistive-switching device decreases gradually when a series of positive set pulses having a same pulse width and a same voltage amplitude are applied thereto, so that the data value stored by the resistive-switching device is increased by '1' sequentially. In this way, multibit storage can be implemented and therefore the multiary addition operation can be performed.

Figure 2:
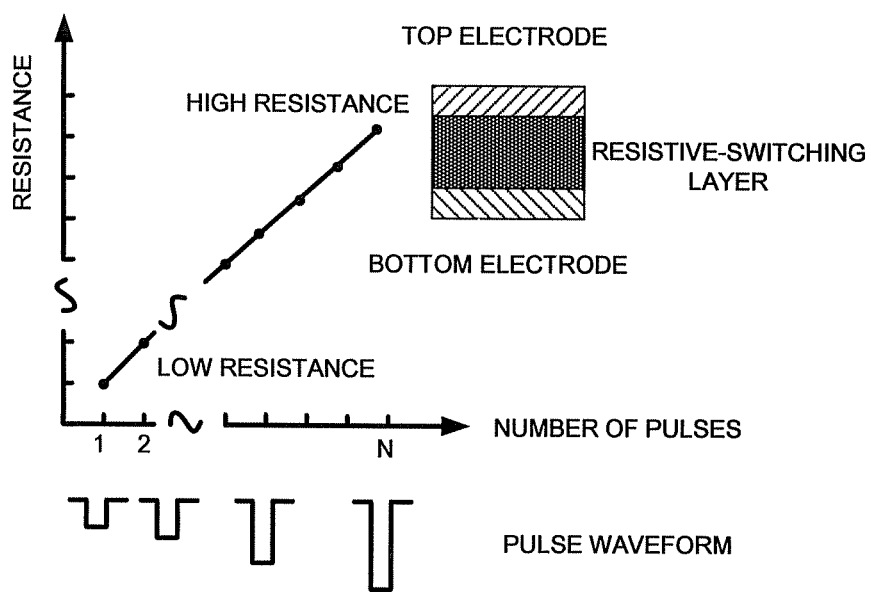
FIG. 2 shows a process in which a resistive-switching device switches from a low resistance state to a high resistance state.

FIG. 2 shows a process in which the resistive-switching device switches from the low resistance state to the high resistance state.

The resistive-switching device shown in FIG. 2 has a similar structure as that shown in FIG. 1. As shown in FIG. 2, the resistive-switching device is initially in a low resistance state. The suitable reset pulse can be achieved by a limited number of experiments. The resistance value of the resistive-switching device may increase to respective intermediate resistance values or the high resistance value according to the reset pulse applied thereto. This process is called "reset." In this embodiment, optionally, one of a plurality of negative reset pulses having a same pulse width and different voltage amplitudes can be optionally applied to the resistive-switching device in the low resistance state, so that the resistance value of the resistive-switching device returns to the high resistance value as shown in FIG. 2. In this way, the data value stored by the resistive-switching device returns to '0' and the adjacent higher bit is increased by '1'.

As an example, in the resistive-switching device illustrated in the present disclosure, the bottom electrode comprises platinum (Pt), and the top electrode comprises titanium nitride (TiN). Accordingly, the set pulse is a positive pulse and the reset pulse is a negative pulse. However, the respective polarities of the set is pulse and the reset pulse can be varied according to the respective materials of the top electrode and the bottom electrode and are not limited to the embodiment described herein.

Figure 3:
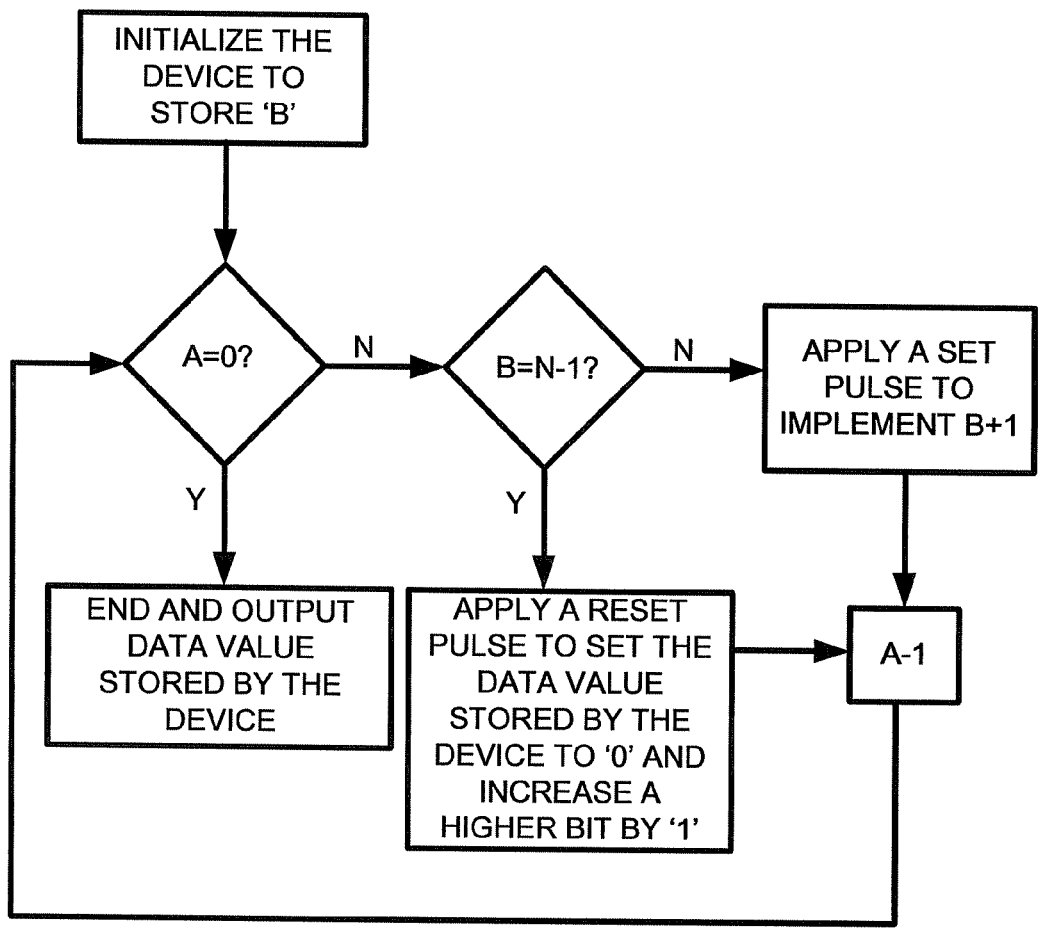
FIG. 3 shows a flow of a method for implementing multiary addition operation by a resistive-switching device.

FIG. 3 shows a flow of a method for implementing multiary addition operation by a resistive-switching device.

The method shown in FIG. 3 combines operations shown in FIGS. 1 and 2. In particular, suitable set and/or reset pulses are applied to the resistive-switching device to implement the multiary addition operation.

In the embodiment shown in FIG. 3, the resistive-switching device comprises N resistance values ranging from the high resistance value to the low resistance value, so that it can implement N-ary addition operation. The data value stored by the resistive-switching device in the high resistance state is set to be '0', and the data value stored by the resistive-switching device in the low resistance state is set to be 'N−1'. An N-ary addition operation of 'A+B' can be implemented by operating the resistive-switching device. Here, both 'B' and 'A' are integers between '0' and 'N−1'. An operation in which an adjacent higher bit is increased by '1' is implemented by setting the data value stored by the resistive-switching device to '0' and increasing the data value stored by a higher-bit resistive-switching device representing the adjacent higher bit by '1'.

The method for implementing the multiary addition operation comprises the following steps.

Step 1, initializing the resistive-switching device to store a value 'B'. In particular, the resistive-switching device is firstly set to store a data value 'N−1' in the low resistance state. Then the resistive-switching device is set to store the value 'B', which may be any integer value between '0' and 'N−2', by being applied a reset pulse having a suitable voltage amplitude.

Step 2, determining whether a value 'A' that is to be added to the value 'B' is '0'.

Step 3, outputting the current data value (the value 'B') stored by the resistive-switching device as a calculation result if the value 'A' is '0'.

Step 4, determining whether the current data value (the value 'B') stored by the resistive-switching device is the largest value (the data value 'N−1' corresponding to the low resistance value of the resistive-switching device) that can be stored by the resistive-switching device if the value 'A' is not '0'.

Step 5, setting the data value stored by the resistive-switching device to '0' (i.e., increasing the resistance value of the resistive-switching device to the high resistance value) by applying a reset pulse thereto if the current data value stored by the resistive-switching device is the largest value, and meanwhile increasing a data value stored by a higher-bit resistive-switching device representing an adjacent higher-bit by '1' by applying a set pulse thereto, so as to complete an operation in which the adjacent higher bit is increased by '1'.

Step 6, increasing the current data value stored by the resistive-switching device by '1' (i.e., decreasing the resistance value of the resistive-switching device to an adjacent resistance value) by applying a set pulse thereto, if the current data value stored by the resistive-switching device is not the largest value.

Step 7, decreasing the value 'A' by '1', returning to the step 2 of determining whether the value 'A' is '0' and performing the steps thereafter.

Next, a manufacturing process for a resistive-switching device according to an embodiment of the present disclosure will be explained.

A conductive material layer is deposited on a silicon substrate by Physical Vapor Deposition (PVD) to form a bottom electrode. The conductive material may be a stable metal such as platinum (Pt). The metal layer may have a thickness of about 5-100 nm. A metal oxide layer is deposited on the bottom electrode by PVD or Atom Layer Deposition (ALD) to form a resistive-switching layer. The metal oxide may be transition metal oxide such as hafnium oxide ($HfO_2$) or titanium oxide, etc. The metal oxide layer may have a thickness of about 5-30 nm. The metal oxide layer is doped by ion implantation. The dopant may be a trivalent metal, e.g., Gd, Al, or La, etc. The dopant may produce more controllable deficiencies so that the resistance switching of the resistive-switching device can be more stable. The dopant and the metal oxide may have an atom ratio of about 0.01~0.1. Then a metal or another conductive material, e.g., titanium nitride (TiN), is deposited on the resistive-switching layer by PVD to form a top electrode. Finally, the resistive-switching device is obtained by opto-lithography.

Next, a method for implementing addition operation using the resistive-switching device according to the present disclosure is explained.

The resistive-switching device may be manufactured according to the above-described method. The resistive-switching device has a structure of TiN/$HfO_2$/Pt, wherein the TiN layer is the top electrode, and the Pt layer is the bottom electrode.

First, a suitable set pulse can be determined by experiment. In this embodiment, a series of pulses each having a pulse width of 20 ns and a voltage amplitude of 4.5V are applied sequentially to the resistive-switching device in the high resistance state. This causes the resistive-switching device to switch between four states from the high resistance state to the low resistance state. The high resistance state may correspond to a data value '3' and the low resistance state may correspond to a data value '0'. Then one of a plurality of reset pulses having a same pulse width of 8 ns and different voltage amplitudes, e.g., −1.75 V, −2 V, and −2.25 V, is applied to the resistive-switching device, and thus the resistive-switching device may return to a resistance state corresponding to one of the data values 2, 1, and 0 from the low resistance state. In this way, quanternary addition can be implemented.

A quanternary addition operation '3+2' will be explained as an example with reference to FIGS. 1 and 2. Each quanternary bit may have a value of 0, 1, 2, or 3. Thus, quanternary numbers 0, 1, 2, 3, 10, and 11 correspond to decimal numbers 0, 1, 2, 3, 4, and 5, respectively. First, the resistive-switching device is set to the low resistance state. Then a pulse having a pulse width of 8 ns and a voltage amplitude of −1.75 V is applied to the resistive-switching device so that it stores a data value '2'. Then a pulse having a pulse width of 20 ns and a voltage amplitude of 4.5 V is applied to the resistive-switching device to decrease its resistance value so that the data value stored by it is increased by '1'. When the resistance value of the resistive-switching device reaches the low resistance value, a pulse having a pulse width of 8 ns and a voltage amplitude of −2.25 V is applied to the resistive-switching device so that it returns to the high resistance state corresponding to the data value '0'. Meanwhile, a set pulse is applied to a higher-bit resistive-switching device representing an adjacent higher bit to increase the data value stored thereby by '1'. As a result, the higher bit is increased by '1'. Next, a pulse having a pulse width of 20 ns and a voltage amplitude of 4.5 V is applied to the resistive-switching device to decrease its resistance value so that the data value stored by it is increased by '1'. Finally, the data value stored by the resistive-switching device is '1' and the higher bit is '1', whereby generating a result '11'.

The present disclosure provides a resistive-switching device capable of implementing multiary addition operation and a method for implementing the multiary addition operation using the resistive-switching device. According to the present disclosure, the resistive-switching device can switch to multiple intermediate resistance values between the low resistance value and the high resistance value with the operation voltage of the resistive-switching device being suitably controlled. In this way, the resistive-switching device can store multiple data values. Furthermore, the resistive-switching device may switch between these resistance values to implement the multiary addition operation.

It should be noted that the above-described embodiments are only for illustrating or explaining the principle of the present disclosure rather than limiting the scope thereof. Any modifications, substitutions, or improvements fall within the scope of the present disclosure without departing from the spirit and scope thereof. Moreover, the attached claims will cover all of the variations and modifications falling within the scope or border of the present disclosure or equivalents thereof.

What is claimed is:

1. A resistive-switching device capable of implementing multiary addition operation, comprising:
   a bottom electrode comprising a conductive material layer;
   a resistive-switching layer comprising a doped metal oxide layer deposited on the bottom electrode; and
   a top electrode comprising a conductive material layer deposited on the metal oxide layer, wherein:
   the resistive-switching device has a plurality of resistance values each corresponding to a respective data value stored by the resistive-switching device and ranging from a high resistance value to a low resistance value, wherein the high resistance value corresponds to a data value '0', and the low resistance value corresponds to a largest data value that can be stored by the resistive-switching device;
   the data value stored by the resistive-switching device is increased by 1 when the resistance value of the resistive-switching device decreases to an adjacent resistance value; and
   the data value stored by the resistive-switching device is set to '0' when the resistance value of the resistive-switching device increases to the high resistance value and meanwhile the data value stored by a higher-bit resistive-switching device representing an adjacent higher bit is increased by '1', whereby an addition operation in which the adjacent higher bit is increased by '1' is completed.

2. The resistive-switching device according to claim 1, wherein:
   the resistance value of the resistive-switching device decreases to an adjacent resistance value and the data value stored by the resistive-switching device is increased by '1' when a set pulse is applied to the resistive-switching device 3. The resistive-switching device according to claim 2, wherein:
   the resistance value of the resistive-switching device decreases gradually when a series of set pulses having a same pulse width and a same voltage amplitude are applied thereto sequentially.

4. The resistive-switching device according to claim 3, wherein:
   the total number of the data values that can be stored by the resistive-switching device corresponds to the pulse width or voltage amplitude of the series of set pulses.

5. The resistive-switching device according to claim 1, wherein the resistance value of the resistive-switching device increases to the high resistance value when a reset pulse having a specific voltage amplitude is applied thereto, whereby the data value stored by the resistive-switching device is set to '0'.

6. The resistive-switching device according to claim 1, wherein the resistance value of the higher-bit resistive-switching device decreases to an adjacent resistance value when a set pulse is applied thereto, whereby the data value stored by the higher-bit resistive-switching device is increased by '1'.

7. The resistive-switching device according to claim 1, wherein the conductive material layer is a polysilicon layer, a platinum layer, a nickel layer, a titanium layer, or a titanium nitride layer.

8. The resistive-switching device according to claim 1, wherein the metal oxide layer is a quadrivalent transition metal oxide layer.

9. The resistive-switching device according to claim 1, wherein the metal oxide layer is doped with trivalent metal.

10. The resistive-switching device according to claim 1, wherein the resistive-switching device is a unipolar resistive-switching device or a bipolar resistive-switching device.

11. A method for implementing multiary addition operation using a resistive-switching device, which has a plurality of resistance values each corresponding to a respective data value stored by the resistive-switching device and ranging from a high resistance value to a low resistance value, wherein the high resistance value corresponds to a data value '0', and the low resistance value corresponds to a largest data value that can be stored by the resistive-switching device, the method comprising:

initializing the resistive-switching device to store a value 'B';

determining whether a value 'A' that is to be added to the value 'B' is '0';

outputting the current data value stored by the resistive-switching device as a calculation result if the value 'A' is '0';

determining whether the current data value stored by the resistive-switching device is the largest value that can be stored by the resistive-switching device if the value 'A' is not '0';

setting the data value stored by the resistive-switching device to '0' if the current data value stored by the resistive-switching device is the largest value and meanwhile increasing a data value stored by a higher-bit resistive-switching device representing an adjacent higher-bit by '1', so as to complete an operation in which the adjacent higher bit is increased by '1';

increasing the current data value stored by the resistive-switching device by '1' if the current data value stored by the resistive-switching device is not the largest value; and decreasing the value 'A' by '1', returning to the step of determining whether the value 'A' is '0' and performing the steps thereafter.

12. The method according to claim 11, wherein:
the resistance value of the resistive-switching device decreases to an adjacent resistance value and the data value stored by the resistive-switching device is increased by '1' when a set pulse is applied to the resistive-switching device; and the resistance value of the resistive-switching device increases to a certain resistance value and the data value stored by the resistive-switching device decreases to a data value corresponding to the certain resistance value when a reset pulse is applied to the resistive-switching device.

13. The method according to claim 12, wherein:
the resistance value of the resistive-switching device decreases gradually when a series of set pulses having a same pulse width and a same voltage amplitude are applied thereto sequentially; and the resistance value of the resistive-switching device increases to a resistance value corresponding to one of a plurality of different voltage amplitudes when one of a plurality reset pulses having a same pulse width and the different voltage amplitudes are applied thereto.

14. The method according to claim 11, wherein the resistance value of the resistive-switching device increases to the high resistance value when the reset pulse having a specific voltage amplitude is applied thereto, whereby the data value stored by the resistive-switching device is set to '0'.

15. The method according to claim 11, wherein the resistance value of the higher-bit resistive-switching device decreases to an adjacent resistance value when a set pulse is applied thereto, whereby the data value stored by the higher-bit resistive-switching device is increased by '1'.

16. The method according to claim 11, wherein the resistive-switching device is a unipolar resistive-switching device or a bipolar resistive-switching device.

17. The resistive-switching device according to claim 1, wherein:
the resistance value of the resistive-switching device increases to a certain resistance value and the data value stored by the resistive-switching device decreases to a data value corresponding to the certain resistance value when a reset pulse is applied to the resistive-switching device.

18. The resistive-switching device according to claim 17, wherein:
the resistance value of the resistive-switching device increases to a resistance value corresponding to one of a plurality of different voltage amplitudes when one of a plurality of reset pulses having a same pulse width and the different voltage amplitudes are applied thereto.

19. The resistive-switching device according to claim 18, wherein:
the total number of the data values that can be stored by the resistive-switching device corresponds to the pulse width or the voltage amplitudes of the reset pulses.

* * * * *